March 24, 1970 E. PHILLIPS 3,502,449

DIFFUSION BARRIER FOR POLYPROPYLENE

Original Filed March 15, 1965

INVENTOR
EUGENE PHILLIPS,

By Albert J. Miller
ATTORNEY.

3,502,449
Patented Mar. 24, 1970

3,502,449

DIFFUSION BARRIER FOR POLYPROPYLENE

Eugene Phillips, Diamond Bar, Calif., assignor to General Dynamics Corporation (Pomona Division), Pomona, Calif., a corporation of Delaware

Original application Mar. 15, 1965, Ser. No. 439,669, now Patent No. 3,377,259, dated Apr. 9, 1968. Divided and this application July 20, 1967, Ser. No. 664,584
Int. Cl. B32b *15/08*
U.S. Cl. 29—195 7 Claims

ABSTRACT OF THE DISCLOSURE

The disclosure provides means and methods for eliminating catalytic oxidation degradation of copper plated or copper laminated polypropylene by interposing a non-catalytic barrier between the polypropylene substrate and the copper layer. This barrier may be silver or other non-catalytic metal which has good electrical conductivity; for example, aluminum, gold, platinum, tin, etc. Non-catalytic metals are defined as those metals which when in contact with polypropylene are significantly less active than copper in promoting oxidative degradation. Thus stripline circuit boards, phase shifters, and other microwave components may be fabricated from polypropylene.

RELATED APPLICATIONS

This application is a divisional application of U.S. patent application Ser. No. 439,669, filed Mar. 15, 1965, now Patent No. 3,377,259 issued Apr. 9 1968 and assigned to the same assignee.

This invention relates to diffusion barriers for material, and particularly to a diffusion barrier for polypropylene in order to avoid the degrading effect of copper on polypropylene.

In selecting the stripline board to be used, for example, in fabricating antennas for air vehicles such as missiles, the objective is to achieve the optimum combination of the following parameters: electrical gain (low loss tangent), design determined dielectric constant, low weight, dimensional stability and good mechanical-thermal properties. Additional desirable properties of the selected board are that it be readily processable with no loss of desired electrical or mechanical characteristics, dimensions, or shape as a consequence of process operations.

Polypropylene has excellent electrical properties, good physical properties and is available at low cost, thus providing a desirable material for many microwave applications. However, when polypropylene is in contact with copper it is subject to oxidative degradation at temperatures above 160° F. Because of this undesirable feature, its use prior to this invention has been limited. It has been determined by this invention that this catalytic effect is minor when polypropylene is in contact with metals such as silver, gold, aluminum, platinum, tin and non-copper containing alloys. These metals may therefore serve as barriers between polypropylene and copper. Thus, in view of this invention, stripline circuit boards, phase shifters, and other microwave components may now be fabricated from polypropylene by making them conductive, for example, with electroless silver plating, then electroplating with a predetermined amount of silver followed by copper plating of the desired thickness, whereby the degrading effect of copper on polypropylene is essentially eliminated.

The prior art, as exemplified by U.S. Patents 3,035,944 and 3,042,591, teaches it to be known in the art to apply a thin continuous coating of metals such as silver to a nonconductor for obtaining an electrically conductive surface or improve adhesion for subsequent plating operations. However, no known teaching prior to this invention is directed to applying a non-catalytic metal barrier between copper and polypropylene to prevent the degradation of the polypropylene.

Therefore, it is an object of this invention to provide a composite whereby degradation of polypropylene is prevented.

A further object of the invention is to provide a barrier between copper and polypropylene, whereby polypropylene, whereby polypropylene can be effectively utilized in microwave applications.

Other objects of the invention will become readily apparent from the following description and accompanying drawings wherein.

Broadly, the present invention provides means and methods for eliminating catalytic oxidation degradation of copper plated or copper laminated polypropylene by interposing a non-catalytic barrier between the polypropylene substrate and the copper layer. This barrier may be silver or other non-catalytic metal which has good electrical conductivity; for example, aluminum, gold, platinum, tin, etc. Non-catalytic metals are defined as those metals which when in contact with polypropylene are significantly less active than copper in promoting oxidative degradation. Thus stripline circuit boards, phase shifter, and other microwave components may be fabricated from polypropylene.

While other metals may be used as the non-catalytic barrier, as pointed out above, the description of the invention will be directed to the use of silver as the barrier but it is in no way intended to limit the invention to the use of silver. The thickness of the barrier layer is 0.0001 inch or greater.

The use of silver for electronic equipment is often discouraged because of possibilities of the phenomena of silver migration. In silver migration an electric field causes silver to move from a silver conductor either into or along an adjoining dielectric body. This can ultimately cause lowering of dielectric strength or failure. The tendency for silver migration to occur is directly related to the water absorption susceptibility of the dielectric material, the relative humidity of the environment, and the applied potential. However, since the polyolefins (polyethylene, polypropylene and copolymers) have almost no water absorptive properties they are extremely resistant to silver migration. In view of tests conducted which showed no detectable silver migration, the silver barrier will not create silver migration problems. Additionally, silver conductive films suitable for build up with electrolytic silver may be deposited with electroless plating solutions similar in operation to those used to deposit copper.

Figure 1:
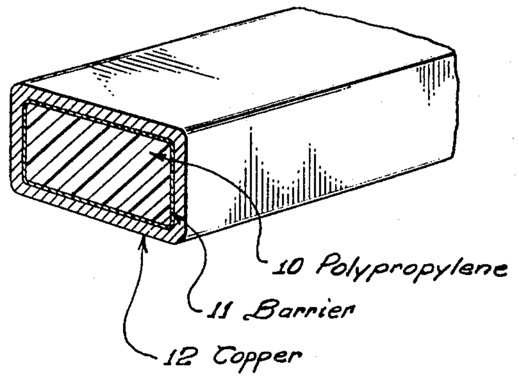
FIG. 1 is a cross-sectional view of polypropylene plated in accordance with the invention.

Referring now to the drawings, FIG. 1 shows a block or bar 10 of polypropylene adapted for use in the fabrication of a phase shifter, for example, having a barrier layer of non-catalytic metal 11 such as silver electroplated to the polypropylene 10, and a plating or layer of copper 12 on the barrier layer 11, the copper being plated to the desired thickness. This same procedure can be applied to polypropylene in any configuration.

Figure 2:
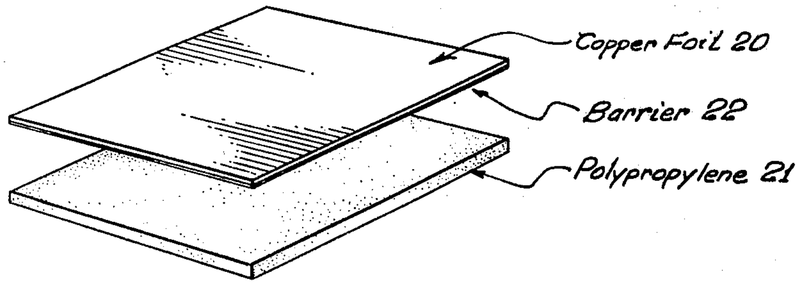
FIG. 2 is a partially exploded view illustrating a laminating process for carrying out the invention.
Figure 3:
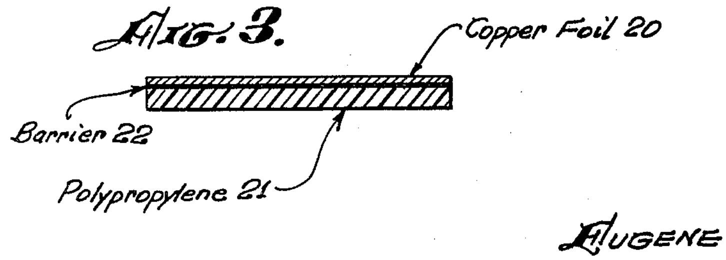
FIG. 3 is a cross-sectional view of FIG. 2 after the laminating process.

In applications as illustrated in FIGS. 2 and 3 where it is desired to laminate copper foil 20 to polypropylene 21, a barrier 22 may be formed by plating silver or other non-catalytic conductive metal 22 on to the side of the foil 20 which will contact the polypropylene 21, the plated foil being then laminated onto the polypropylene by conventional methods.

The following sequence of steps set forth a method for fabricating plated polypropylene, similar to that illustrated in FIG. 1.

(1) Vapor blast the surfaces of the polypropylene material to be plated.

(2) Scrub with an abrasive cleaner.

(3) Immerse for 15 minutes in chromic-sulfuric oxidizing etch.

(4) Rinse thoroughly in deionized water and check to insure that the surface is completely wetted. If areas greater than ¼ square inch remain unwetted, repeat steps 3 and 4.

(5) Immerse in stannous chloride solution for 15 minutes.

(6) Rinse.

(7) Rinse in deionized water.

(8) Mix silvering solution and immersion plate the board with silver by placing it in the solution until completely coated with a silver conductive coat.

(9) Rinse in deionized water.

(10) Cyanide dip.

(11) Rinse.

(12) Electroplate at 5 volts and 15 a.s.f. in silver strike bath for 10 to 30 seconds.

(13) Electroplate in silver plate bath at 10 a.s.f. for sufficient time to achieve a thickness of 0.0002 to 0.0003 inch.

(14) Rinse in deionized water.

(15) Sulfuric acid dip.

(16) Rinse in deionized water.

(17) Electroplate in acid copper plating bath to the desired thickness.

The above sequence of steps may be modified as follows:

(1) Omit steps 2 and 3 and in place thereof, scrub the board or material with a slurry of abrasive-hypochlorite scrub-oxidizer mixture.

(2) In place of coating the board with silver by immersion as described in step 8, the silvering solution may be sprayed from a dual spray gun.

The following are formulations for the special solution and mixtures utilized in the above described method. Formulations for conventional electroplating bath and dips utilized are omitted.

(1) Chromic-sulfuric oxidation etch:
- $H_2SO_4$—100 ml.
- $H_2O$—50 ml.
- $K_2Cr_2O7$—5 gms.

(2) Scrub-oxidizer mixture:
- $Ca(C1O)_2$—40 gms.
- Ajax, 300 mesh Tripoli, or Pumice—50 gms.
- $Co(NO_3)2$—0.3 gms.

(3) Stannous chloride solution:
- $SnCl_2$—70 gms.
- HCl—40 ml.
- $H_2O$—To make one liter.

(4) Electroless silver plating solution:
- Silver solution:
  - $AgNO_3$—60 gms.
  - $NH_4OH$—60 ml.
  - $H_2O$—To make one liter.
- Reducer:
  - HCOH—66 ml.
  - $H_2O$—To make one liter.

Mix equal volumes of silver solution and reducer as needed for plating.

It has thus been shown that this invention provides a novel material (plated polypropylene) which has the desirable features required for microwave applications, and methods for applying a layer of copper on the polypropylene with a barrier layer of non-catalytic conductive metal interposed between the polypropylene and copper for preventing direct contact therebetween and the associated oxidative degradation of the polypropylene.

Although particular embodiments and methods have been illustrated and described, modifications and changes will become apparent to those skilled in the art, and it is intended to cover in the appended claims all such modifications and changes as come within the true spirit and scope of the invention.

What is claimed is:

1. A material comprising a layer of polypropylene, a layer of non-catalytic conductive metal of the group consisting of silver, aluminum, platinum and tin adjacent the polypropylene, and a layer of copper adjacent the non-catalytic conductive metal.

2. The material defined in claim 1 wherein said non-catalytic conductive metal is silver.

3. The material defined in claim 1, wherein said non-catalytic conductive metal is aluminum.

4. The material defined in claim 1, wherein said non-catalytic conductive metal is platinum.

5. The material defined in claim 1, wherein said non-catalytic conductive metal is tin.

6. A material for microwave applications comprising: a layer of polypropylene, a barrier layer of silver, and a layer of copper, said silver barrier layer serving to substantially prevent oxidative degradation of polypropylene due to contact with copper.

7. A material for microwave applications comprising: a core of polypropylene, a barrier layer of silver coated on and extending about said core, and a layer of copper coated on and extending about said barrier layer, said barrier layer serving to substantially prevent oxidative degradation of the polypropylene core due to contact with copper.

References Cited

UNITED STATES PATENTS 2,718,494 9/1955 Faust _______________ 204—12

L. DEWAYNE RUTLEDGE, Primary Examiner

E. L. WEISE, Assistant Examiner

U.S. Cl. X.R.

29—197, 199